United States Patent [19]

Kasugai et al.

[11] Patent Number: 5,017,870
[45] Date of Patent: May 21, 1991

[54] METHOD AND SYSTEM FOR SETTING AND DISPLAYING MAGNETIC RESONANCE IMAGE ACQUISITION DURATION INFORMATION

[75] Inventors: Takao Kasugai; Tadahiro Takeda, both of Tochigi, Japan

[73] Assignee: Kabushiki Kaisha Toshiba, Kawasaki, Japan

[21] Appl. No.: 425,932

[22] Filed: Oct. 24, 1989

Related U.S. Application Data

[63] Continuation-in-part of Ser. No. 7/143,708, Jan. 14, 1988, abandoned.

[51] Int. Cl.⁵ .............................................. G01V 3/00
[52] U.S. Cl. ................................ 324/318; 128/653 A
[58] Field of Search .................... 324/309, 318, 322; 128/653 A, 653 R, 24 AA, 25 R; 340/568, 600, 732, 756

[56] References Cited

U.S. PATENT DOCUMENTS

| | | | |
|---|---|---|---|
| 4,279,254 | 7/1981 | Boschetti et al. | 340/600 |
| 4,844,055 | 7/1989 | Rawcliffe | 128/25 R |
| 4,878,499 | 11/1989 | Suzuki et al. | 324/309 |
| 4,901,141 | 2/1990 | Costello | 324/318 |
| 4,903,703 | 2/1990 | Igarashi et al. | 128/653 A |

FOREIGN PATENT DOCUMENTS

0320347  6/1989  European Pat. Off. ........ 128/653 A

*Primary Examiner*—Michael J. Tokar
*Assistant Examiner*—Louis M. Arana
*Attorney, Agent, or Firm*—Foley & Lardner

[57] ABSTRACT

A repeat interval, the number of encoding and the number of excitations are set in a processor by inputting from a keyboard before the start of image acquisition. The image acquisition duration is calculated using these set parameters, and the value corresponding to the image acquisition duration is set in a timer. The timer performs down-counting during image acquisition. A remaining image acquisition duration generated from the timer is displayed on a display and/or is output as voice signals from a voice output unit. Informing the patient of the time remaining until completion of image acquisition reduces the patient's anxiety and thus reduces motion artifacts.

34 Claims, 6 Drawing Sheets

METHOD AND SYSTEM FOR SETTING AND DISPLAYING MAGNETIC RESONANCE IMAGE ACQUISITION DURATION INFORMATION

This application is a continuation-in-part of application Ser. No. 07/143,708, filed Jan. 14, 1988 now abandoned.

BACKGROUND OF THE INVENTION

The present invention relates to a method and a system for setting and displaying image acquisition duration information of a magnetic resonance imaging apparatus (hereinafter referred to as an MRI apparatus), wherein the duration required for acquiring an image is calculated beforehand and the remaining duration is displayed.

Generally, when image data are acquired by use of an MRI apparatus, a slice position of an object to be examined is predetermined by a doctor or some other qualified person. Once the slice position has been determined, the doctor need not attend to the apparatus during the image acquisition process. Therefore, the doctor is free from the task of acquiring image data during this duration.

Although, as is explained above, the doctor need not attend to the imaging apparatus during the image acquisition operation, the doctor does not know the image acquisition duration in advance in a conventional MRI apparatus. The doctor only knows the encoding information for the magnetic resonance (MR) signal data to be acquired.

During the imaging process, motion artifacts, or movements of the patient, cause blurring in an acquired image. One cause of MR imaging motion artifacts is the patient's anxiety due to not knowing the period of time remaining for completion of an image acquisition. This anxiety causes the patient to move and thus blur an acquired image.

Consequently, the development of a method which enables the displaying of the remaining duration by calculating an image acquisition duration and by counting until the image acquisition end time has been desired.

SUMMARY OF THE INVENTION

It is an object of the present invention, therefore, to provide a method and a system for setting and displaying the image acquisition duration of a magnetic resonance imaging apparatus, wherein the duration required for acquiring an image is calculated beforehand and the remaining duration of the image acquisition is displayed.

Another object of the present invention is to minimize a patient's anxiety by informing the patient of the time remaining for image acquisition.

According to the present invention, there is provided a method for setting and displaying a magnetic resonance image acquisition duration, comprising the steps of: setting parameters required for obtaining a magnetic resonance image acquisition duration; calculating the image acquisition duration from the parameters set; counting from an image acquisition start time, to obtain a duration until the end of image acquisition; and outputting data representing a remaining image acquisition duration to a patient by detecting a count value.

According to the present invention, there is also provided a system for setting and displaying a magnetic resonance image acquisition duration, comprising: means for inputting an image acquisition start command and input parameters required for obtaining an image acquisition duration; means for calculating the image acquisition duration from the input parameters; means for counting from an image acquisition start time, in accordance with the image acquisition start command; and means for outputting data representing a remaining image acquisition duration to a patient by detecting a count value.

DETAILED DESCRIPTION OF THE PREFERRED EMBODIMENTS

An embodiment of the present invention will now be described, with reference to the accompanying drawings.

Figure 1:
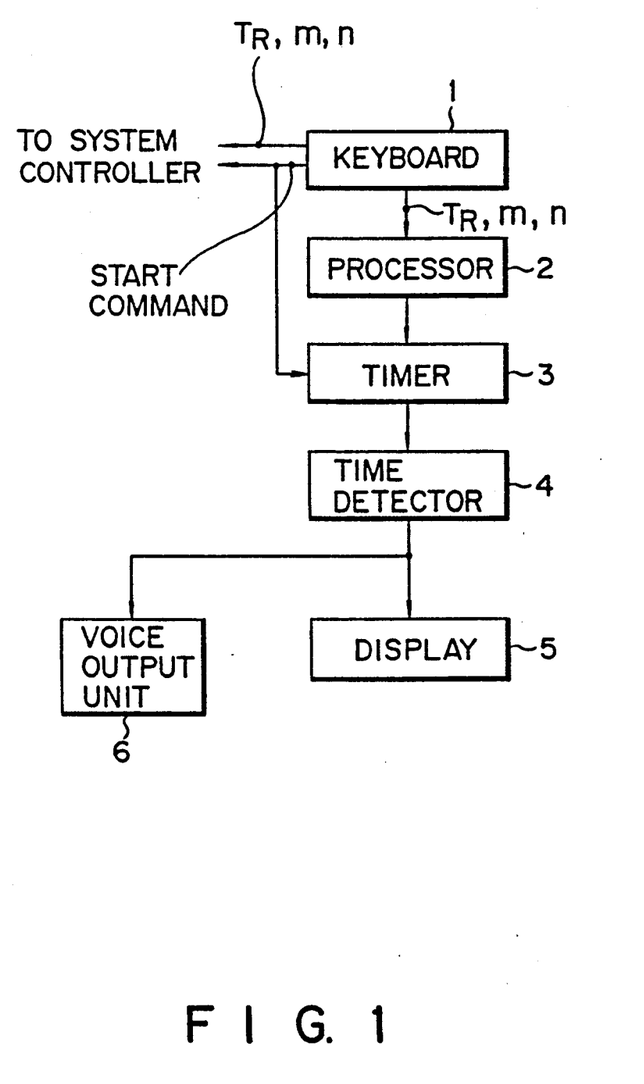
FIG. 1 is a block diagram showing the arrangement of an embodiment of a system for setting and displaying a magnetic resonance image acquisition duration according to the present invention.
Figure 2A:
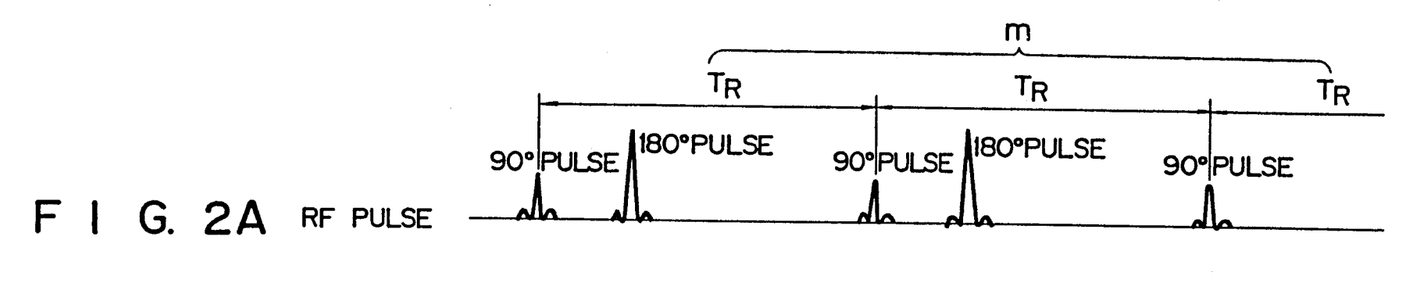
FIGS. 2A to 2E show a sequence in the system shown in FIG. 1.
Figure 2B:
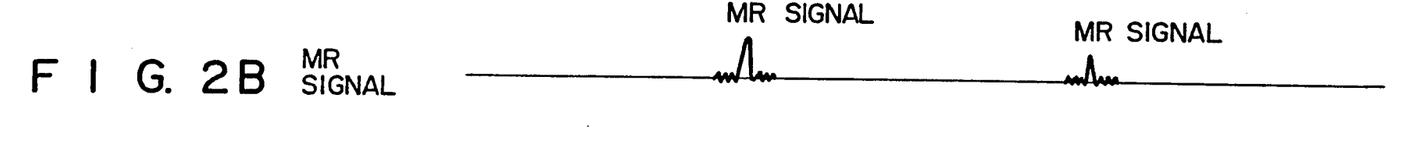
Figure 2C:
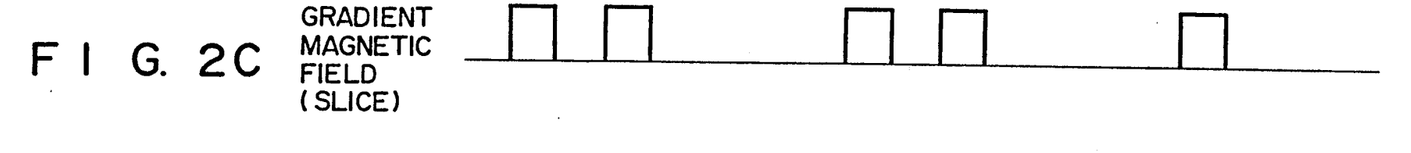
Figure 2D:
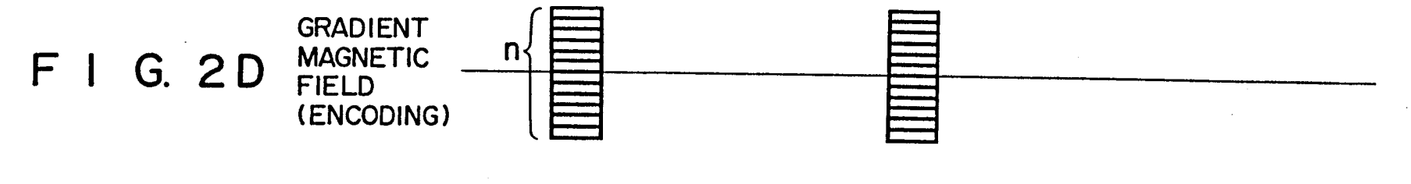
Figure 2E:
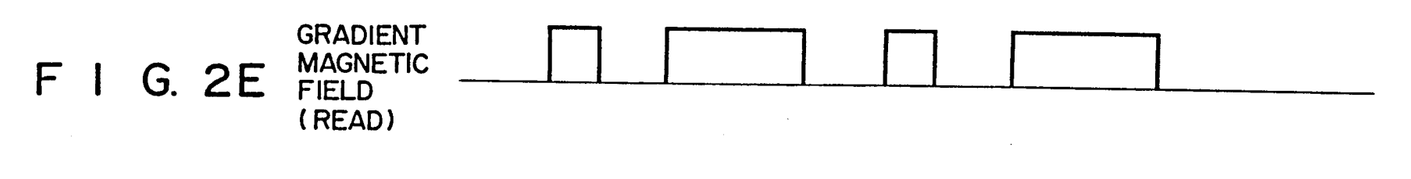

Referring to FIG. 1, keyboard 1 is used to input various image acquisition conditions into processor 2 and into a system controller (not shown) which controls an MRI apparatus. An image acquisition start command is input into timer 3 and into the system controller by keyboard 1.

Processor 2 calculates the magnetic resonance image acquisition duration in accordance with the various image acquisition conditions, that is, the repeat interval, the number of encoding, and the number of excitations. Timer 3 starts in response to an image acquisition start command input from keyboard 1. The image acquisition duration calculated by processor 2 is set in timer 3, and timer 3 counts down from the value representing the image acquisition duration. Time detector 4 detects the count value of timer 3. The detected count value is displayed on display 5 or is output through voice output unit 6.

The operation of the system according to this embodiment will now be described in further detail.

The image acquisition conditions, including the repeat interval, the number of encoding, and the number of excitations are input to processor 2 via keyboard 1. Based on these conditions, processor 2 calculates an image acquisition duration. Upon completion of this calculation, an image acquisition start command is input by keyboard 1 to timer 3 and to the system controller. As a result, an MR signal from a predetermined slice of an object is detected in accordance with the sequence shown, by way of example, in FIGS. 2A to 2E.

In the sequence shown in FIGS. 2A to 2E, image acquisition duration T is calculated utilizing the following equation and the image acquisition conditions input via keyboard 1.

$$T = T_R \cdot m \cdot n \quad (1)$$

Where $T_R$ is the repeat interval, n is the number of encoding data, and m is the number of excitation times. In this manner, image acquisition duration T is set in timer 3, where down-counting is performed, and the count value corresponding to the remaining image acquisition duration is detected by time detector 4. Based on the count value received from time detector 4, the remaining image acquisition duration is shown on display 5 and/or output through voice output unit 6.

Figure 3:
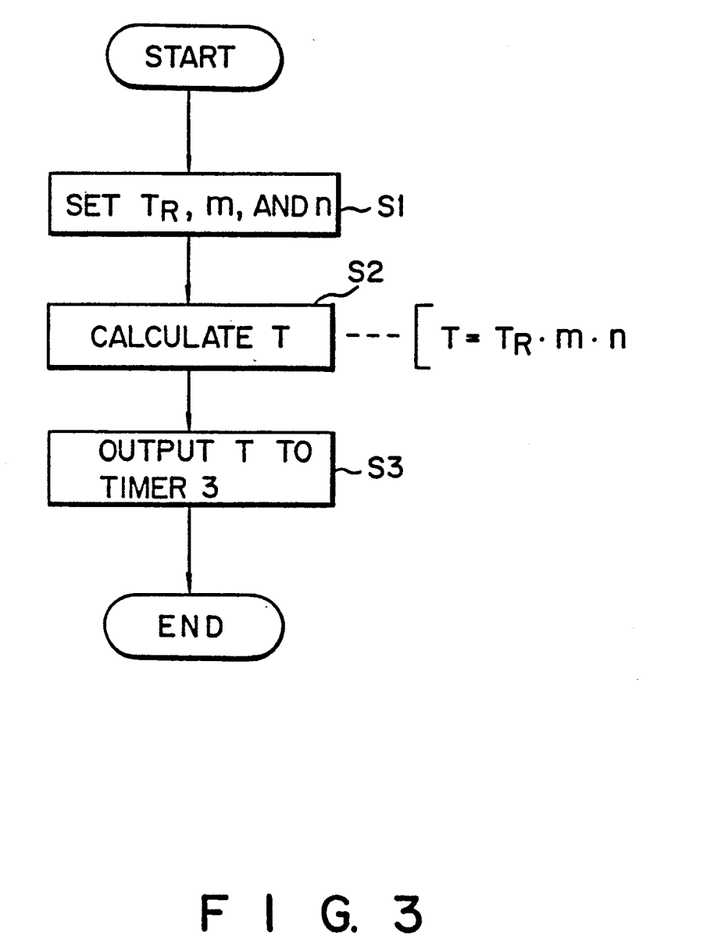
FIG. 3 is a flow chart showing operation of a processor in the system shown in FIG. 1.

The processing operation of processor 2 will now be described, with reference to the flow chart shown in FIG. 3.

In step S1, the image acquisition conditions for calculating an image acquisition duration are set in processor 2 by keyboard 1. In this embodiment, repeat interval $T_R$, the number of encoding data n, and the number of excitation times m are set in processor 2. In step S2, image acquisition duration T is calculated from the image acquisition conditions set in step S1 using Equation (1). In step S3, the count value corresponding to image acquisition duration T is outputted to timer 3.

In the system of this embodiment, the doctor and operator can easily ascertain the start time of the next image acquisition by reading the remaining image acquisition duration shown on display 5 and adding this remaining image acquisition duration to the time of day. Alternatively, the display 5 can display the time of day the current image acquisition will be completed. The doctor need not attend to the apparatus during image acquisition and can return to the apparatus just prior to completion of image acquisition. Therefore image acquisition can be performed more efficiently. When voice output unit 6 or the like is utilized, the patient is also informed of the remaining image acquisition duration. Voice outputting has an advantage over a visual display in not requiring the patient to move to view a display. Since the patient is kept informed of the remaining image acquisition duration, the patient's anxiety, and thus movement, is reduced.

Figure 4:
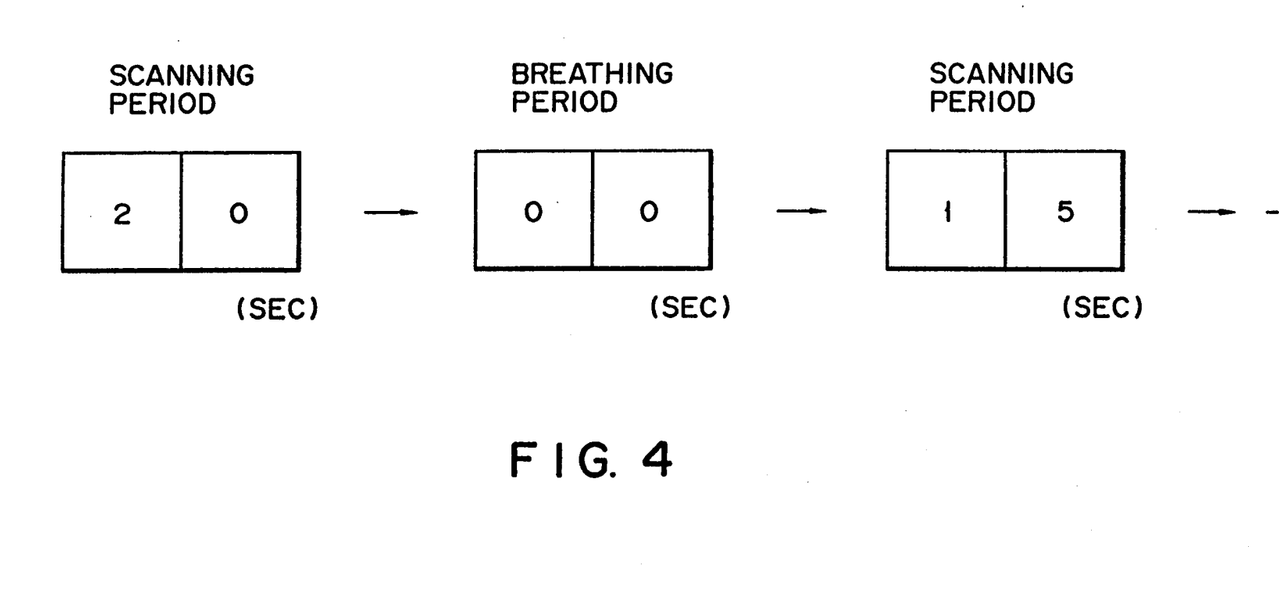
FIG. 4 shows display examples of MR image acquisition duration information that is conveyed to a patient.

Since it takes a long time, such as several minutes or tens of minutes, to acquire an MR image in comparison with the acquisition duration of an X-ray CT image or the like, an artifact due to breathing motion of the patient occurs while obtaining an MR image of the abdomen of the patient. Accordingly, a plurality of scans during a breathing stoppage are frequently performed so as to obtain a plurality of MR images (slice images). In this case, a time period between scans is provided to allow the patient to breath. During this breathing period representing the rest time of the patient, data representing the remaining MR image acquisition duration, for example a zero, is displayed as shown in FIG. 4. After completion of scan settings by a technician, the next group of scans is started.

At least two display formats for remaining MR image acquisition duration information are available. For example, (1) the MR image acquisition duration can be calculated in accordance with the total acquisition duration utilizing the number of scans and the rest times in order to display total remaining MR image acquisition duration data, or (2) the MR image acquisition duration for each scan can be calculated in order to display remaining MR image acquisition duration data for each scan.

As described above, in format (2), the remaining MR image acquisition duration data is zero during the breathing period between scans. Format (2) is frequently preferred over format (1) by patients. The time remaining in a particular breathing period can also be displayed.

Figure 5:
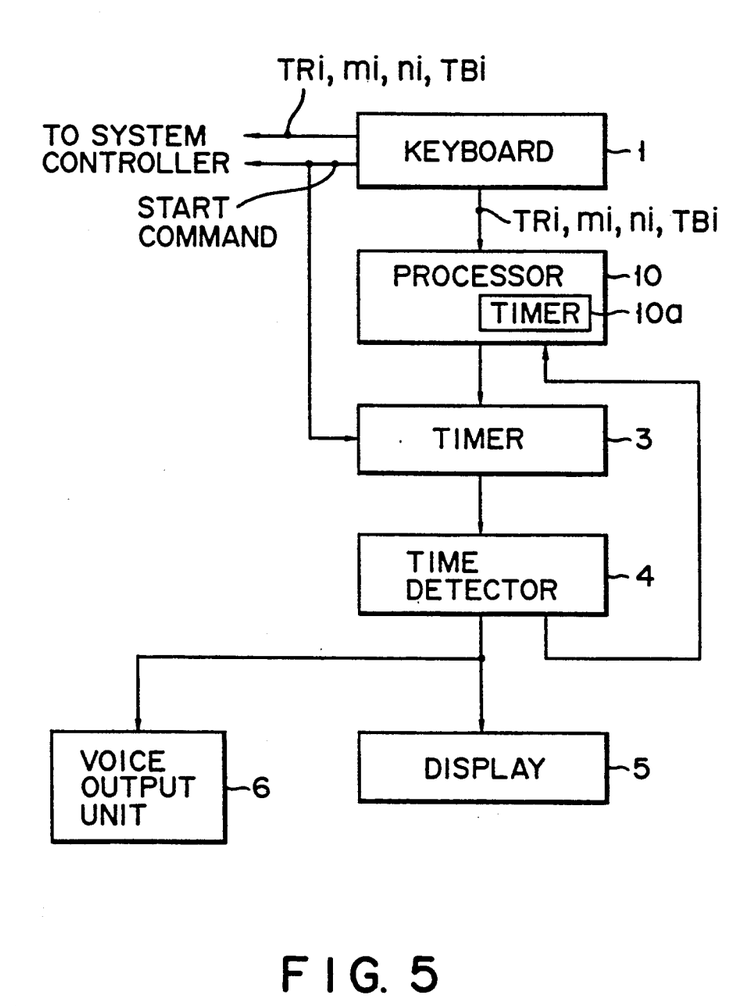
FIG. 5 is a block diagram showing an arrangement of another embodiment of a system according to the present invention.

FIG. 5 shows an arrangement of an embodiment implementing format (2). This system differs from the system shown in FIG. 1 in that processor 10 includes a timer 10a and an output signal from time detector 4 is supplied to processor 10.

Figure 6:
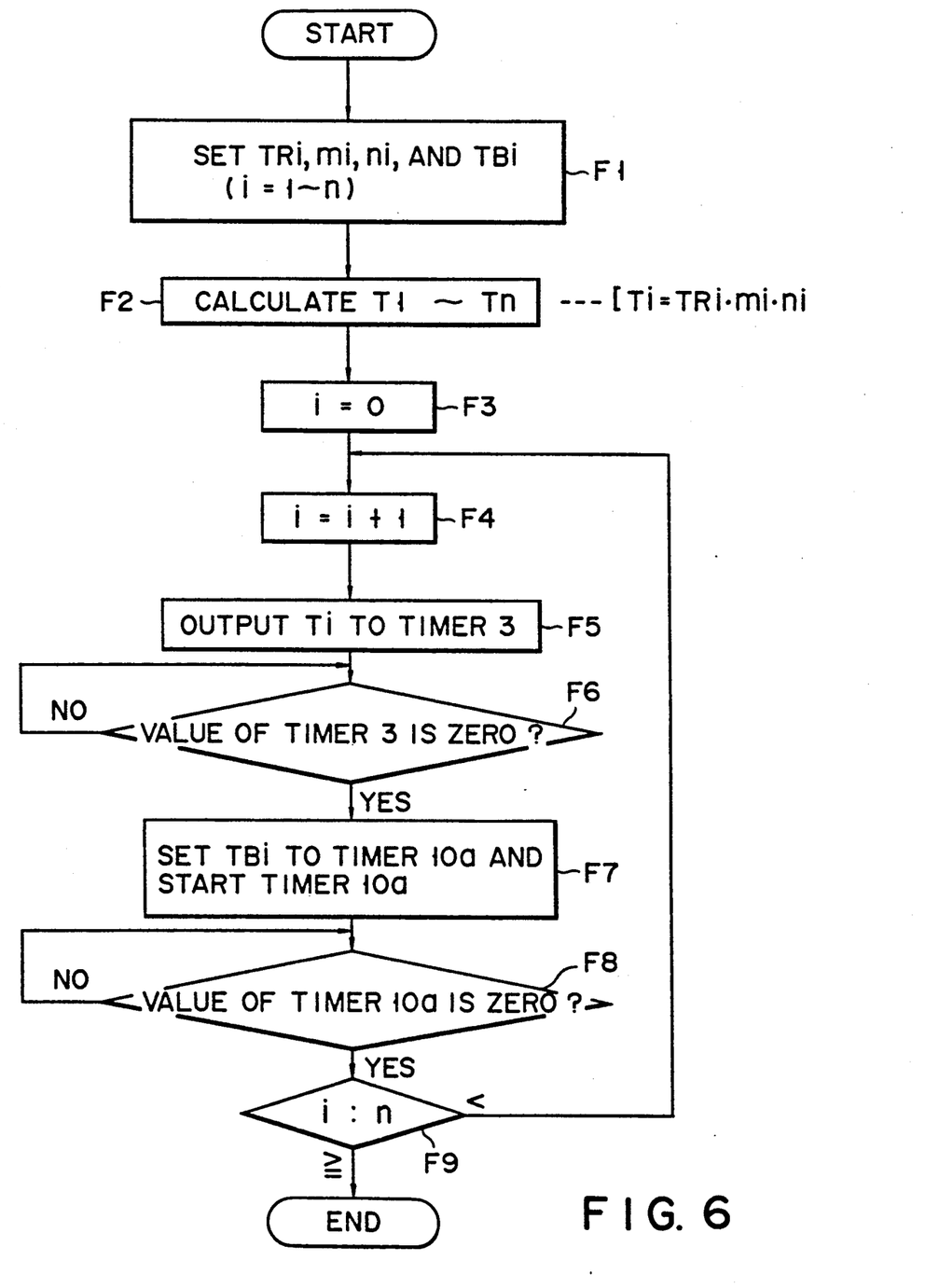
FIG. 6 is a flow chart showing operation of a processor in the system shown in FIG. 5.

The operation of the FIG. 5 system will be described below with reference to FIG. 6.

In step F1, parameters for image acquisition are set via keyboard 1. In this embodiment, repeat intervals TR1 to TRn, the number of encoding data n1 to nn, excitation times m1 to mn, and breathing intervals TB1 to TBn are set. In step F2, image acquisition durations T1 to Tn are calculated from the parameters set in step F1. A variable i is set to zero in step F3, and is incremented by one in step F4.

In step F5, a value corresponding to the image acquisition duration Ti is output to timer 3, thereby starting timer 3.

In step F6, whether or not the value of the time of timer 3 is zero is determined. When the value of the time of timer 3 is zero, timer 10a is set to TBi and is started, in step F7. During this period, timer 3 is not operated.

In step F8, whether or not the value of the time of timer 10a is zero is determined. When the value of the time of timer 10a is zero, variable i is compared with variable n in step F9.

Step F4 to step F9 are performed until $i \geq n$.

By the above processing, the MR image acquisition duration for each scan is displayed.

Thus, by informing a patient of the time remaining for image acquisition by, for example, a voice outputting circuit, the patient's anxiety is reduced, the patient is able to remain more motionless, and a clearer image is produced. In addition, the doctor can use his time more efficiently when he knows the time remaining in the image acquisition process.

The present invention is not limited to these embodiments, and various modifications and changes may be made within the spirit and scope of the invention.

What is claimed is:

1. A method for calculating a magnetic resonance image acquisition duration and for displaying data representing a remaining magnetic resonance image acquisition duration, the method comprising the steps of:

setting parameters for obtaining the magnetic resonance image acquisition duration;

calculating the magnetic resonance image acquisition duration using the parameters;

counting from an image acquisition start time, associated with the magnetic resonance image acquisition duration, to obtain a duration corresponding to a completion of magnetic resonance image acquisition; and displaying data representing the remaining magnetic resonance image acquisition duration to a patient such that an anxiety of the patient is minimized, the data obtained by detecting a count value.

2. A method according to claim 1, wherein the counting step includes the steps of:

setting the image acquisition start time equal to the magnetic resonance image acquisition duration; and down-counting from the image acquisition start time.

3. A method according to claim 1, wherein the magnetic resonance image acquisition duration is calculated before starting magnetic resonance image acquisition.

4. A method according to claim 1, wherein the parameters include a repeat interval, a number of encoding data, and a number of excitation times.

5. A system for calculating a magnetic resonance image acquisition duration and for displaying data representing a remaining magnetic resonance image acquisition duration, the system comprising:
inputting means for receiving an image acquisition start command and parameters for calculating the magnetic resonance image acquisition duration;
calculating means for calculating the magnetic resonance image acquisition duration using the parameters received by the inputting means;
counting means for counting from an image acquisition start time associated with the magnetic resonance image acquisition duration, in accordance with the image acquisition start command received by the inputting means; and
displaying means for displaying data representing the remaining magnetic resonance image acquisition duration to a patient such that an anxiety of the patient is minimized, the data obtained by detecting a count value of the counting means.

6. A system according to claim 5, wherein the counting means includes:
setting means for setting the image acquisition start time equal to the magnetic resonance image acquisition duration; and
down-counting means for down-counting from the image acquisition start time set by the setting means.

7. A system according to claim 5, wherein the image acquisition start time is calculated before starting magnetic resonance image acquisition.

8. A system according to claim 5, wherein the parameters include a repeat interval, a number of encoding data, and a number of excitation times.

9. A method for calculating a magnetic resonance image acquisition duration and for voice-outputting data representing a remaining magnetic resonance image acquisition duration, the method comprising the steps of:
setting parameters for calculating the magnetic resonance image acquisition duration;
calculating the magnetic resonance image acquisition duration from the parameters;
counting, from an image acquisition start time associated with the magnetic resonance image acquisition duration, to obtain a duration corresponding to a time remaining until completion of magnetic resonance image acquisition; and
voice-outputting data representing the remaining magnetic resonance image acquisition duration to a patient such that an anxiety of the patient is minimized, said data obtained by detecting a count value.

10. A method according to claim 9, wherein the counting step includes the steps of:
setting the image acquisition start time equal to the magnetic resonance image acquisition duration; and
down-counting from the image acquisition start time.

11. A method according to claim 9, wherein the parameters include a repeat interval, a number of encoding data, and a number of excitation times.

12. A system for calculating a magnetic resonance image acquisition duration and for voice-outputting data representing a remaining magnetic resonance image acquisition duration, the system comprising:
inputting means for receiving an image acquisition start command and parameters for calculating the magnetic resonance image acquisition duration;
calculating means for calculating the magnetic resonance image acquisition duration using the parameters received by the inputting means;
counting means for counting from an image acquisition start time associated with the magnetic resonance image acquisition duration, in accordance with the image acquisition start command received by the inputting means; and
voice-outputting means for voice-outputting data representing the remaining magnetic resonance image acquisition duration to a patient such that an anxiety of the patient is minimized, the data obtained by detecting a count value of the counting means.

13. A system according to claim 12, wherein the counting means includes:
setting means for setting the image acquisition start time equal to the magnetic resonance image acquisition duration; and
down-counting means for down-counting from the image acquisition start time set by the setting means.

14. A system according to claim 12, wherein the parameters include a repeat interval, a number of encoding data, and a number of excitation times.

15. A method for calculating a magnetic resonance image acquisition duration and for displaying data representing a remaining magnetic resonance image acquisition duration, the method comprising the steps of:
setting acquisition parameters for the magnetic resonance image acquisition duration and setting rest parameters for a rest period of a patient;
calculating the magnetic resonance image acquisition duration from the acquisition parameters;
counting from an image acquisition start time associated with the magnetic resonance image acquisition duration to obtain a duration indicative of a time until completion of a magnetic resonance image acquisition;
displaying display data representing the remaining magnetic resonance image acquisition duration to the patient such that an anxiety of the patient is minimized, the display data obtained by detecting a count value; and
counting from a rest period start time associated with the rest period when the display data reaches a predetermined value.

16. A method for calculating a magnetic resonance image acquisition duration and for voice-outputting data representing a remaining magnetic resonance image acquisition duration, the method comprising the steps of:
setting acquisition parameters for the magnetic resonance image acquisition duration and setting rest parameters for a rest period of a patient;
calculating the magnetic resonance image acquisition duration from the acquisition parameters;
counting from an image acquisition start time associated with the magnetic resonance image acquisition duration to obtain a duration indicative of a time until completion of a magnetic resonance image acquisition;

voice-outputting voice-output data representing the remaining magnetic resonance image acquisition duration to the patient such that an anxiety of the patient is minimized, the voice-output data obtained by detecting a count value; and counting from a rest period start time associated with the rest period when the voice-output data reaches a predetermined value.

17. A method for calculating a magnetic resonance image acquisition duration and for displaying data representing a remaining magnetic resonance image acquisition duration, the method comprising the steps of:

setting acquisition parameters for the magnetic resonance image acquisition duration and setting rest parameters for a rest period of a patient;

calculating the magnetic resonance image acquisition duration from the acquisition parameters;

displaying display data representing the remaining magnetic resonance image acquisition duration to the patient such that an anxiety of the patient is minimized, the remaining magnetic resonance image acquisition duration indicative of a time until completion of a magnetic resonance image acquisition; and displaying a remaining rest period duration when the display data reaches a predetermined value.

18. A method for calculating a magnetic resonance image acquisition duration and for voice-outputting data representing a remaining magnetic resonance image acquisition duration, the method comprising the steps of:

setting acquisition parameters for the magnetic resonance image acquisition duration and setting rest parameters for a rest period of a patient;

calculating the magnetic resonance image acquisition duration from the acquisition parameters;

voice-outputting voice-output data representing the remaining magnetic resonance image acquisition duration to the patient such that an anxiety of the patient is minimized, the remaining magnetic resonance image acquisition duration indicative of a time until completion of a magnetic resonance image acquisition; and displaying a remaining rest period duration when the voice-output data reaches a predetermined value.

19. A method for calculating a magnetic resonance image acquisition duration and for displaying data representing a remaining magnetic resonance image acquisition duration, the method comprising the steps of:

receiving parameters for calculating the magnetic resonance image acquisition duration;

calculating the magnetic resonance image acquisition duration using the parameters; and displaying data representing the remaining magnetic resonance image acquisition duration to a patient such that an anxiety of the patient is minimized, the remaining magnetic resonance image acquisition duration indicative of a time until completion of a magnetic resonance image acquisition.

20. A method according to claim 19, wherein the magnetic resonance image acquisition duration is calculated before starting magnetic resonance image acquisition.

21. A method for setting a magnetic resonance image acquisition duration and for displaying data representing a remaining magnetic resonance image acquisition duration, the method comprising the steps of:

setting parameters for obtaining the magnetic resonance image acquisition duration;

calculating the magnetic resonance image acquisition duration using the set parameters;

counting from an image acquisition start time, corresponding to the magnetic resonance image acquisition duration, to obtain a duration corresponding to a completion of magnetic resonance image acquisition; and displaying data representing the remaining magnetic resonance image acquisition duration to a patient, the displayed data obtained by detecting a count value.

22. A method according to claim 21, wherein the step of counting includes the steps of:

setting the image acquisition start time corresponding to the magnetic resonance image acquisition duration; and down-counting from the set image acquisition start time.

23. A method according to claim 21, wherein the magnetic resonance image acquisition duration is calculated before starting magnetic resonance image acquisition.

24. A method according to claim 21, wherein the parameters include a repeat interval, a number of encoding data, and excitation times.

25. A system for setting a magnetic resonance image acquisition duration and for displaying data representing a remaining magnetic resonance image acquisition duration, the system comprising:

inputting means for inputting an image acquisition start command and parameters for obtaining the magnetic resonance image acquisition duration;

calculating means for calculating the magnetic resonance image acquisition duration using the parameters input by the inputting means;

counting means for counting from an image acquisition start time corresponding to the magnetic resonance image acquisition duration, in accordance with the image acquisition start command input by the inputting means; and displaying means for displaying data representing a remaining magnetic resonance image acquisition duration to a patient, the displayed data obtained by detecting a count value counted by the counting means.

26. A system according to claim 25, wherein the counting means includes:

setting means for setting the image acquisition start time corresponding to the magnetic resonance image acquisition duration; and down-counting means for down-counting from the image acquisition start time set by the setting means.

27. A system according to claim 25, wherein the image acquisition start time is calculated before starting magnetic resonance image acquisition.

28. A system according to claim 25, wherein the parameters include a repeat interval, a number of encoding data, and excitation times.

29. A method for setting a magnetic resonance image acquisition duration and for voice-outputting data representing a remaining magnetic resonance image acquisition duration, the method comprising the steps of:

setting parameters for obtaining the magnetic resonance image acquisition duration;

calculating the magnetic resonance image acquisition duration from the set parameters;

counting, from an image acquisition start time corresponding to the magnetic resonance image acquisition duration, to obtain a duration corresponding to a time remaining until completion of magnetic resonance image acquisition; and voice-outputting data representing the remaining magnetic resonance image acquisition duration to a patient, said voice-outputted data obtained by detecting a count value.

30. A method according to claim 29, wherein the counting step includes the steps of:

setting the image acquisition start time corresponding to the magnetic resonance image acquisition duration; and down-counting from the set image acquisition start time.

31. A method according to claim 29, wherein the parameters include a repeat interval, a number of encoding data, and excitation times.

32. A system for setting a magnetic resonance image acquisition duration and for voice-outputting data representing a remaining magnetic resonance image acquisition duration, the system comprising:

inputting means for inputting an image acquisition start command and parameters for obtaining the magnetic resonance image acquisition duration;

calculating means for calculating the magnetic resonance image acquisition duration using the parameters input by the inputting means;

counting means for counting from an image acquisition start time corresponding to the magnetic resonance image acquisition duration, in accordance with the image acquisition start command input by the inputting means; and voice-outputting means for voice-outputting data representing the remaining magnetic resonance image acquisition duration to a patient, the voice-outputted data obtained by detecting a count value counted by the counting means.

33. A system according to claim 32, wherein the counting means includes:

setting means for setting the image acquisition start time corresponding to the magnetic resonance image acquisition duration; and down-counting means for down-counting from the image acquisition start time set by the setting means.

34. A system according to claim 32, wherein the parameters include a repeat interval, a number of encoding data, and excitation times.

* * * * *

UNITED STATES PATENT AND TRADEMARK OFFICE
CERTIFICATE OF CORRECTION

PATENT NO. : 5,017,870

DATED : May 21, 1991

INVENTOR(S) : Takao Kasugai and Tadahiro Takeda

It is certified that error appears in the above-identified patent and that said Letters Patent is hereby corrected as shown below:

On the title page, item [30] Foreign Application Priority Data, please insert the following:

--January 16, 1987  [JP]   Japan.............62-6113--.

Signed and Sealed this

Fifth Day of January, 1993

Attest:

DOUGLAS B. COMER

*Attesting Officer*   Acting Commissioner of Patents and Trademarks